(12) United States Patent
Inoue et al.

(10) Patent No.: US 9,795,030 B2
(45) Date of Patent: *Oct. 17, 2017

(54) METAL-CLAD LAMINATE AND PRINTED WIRING BOARD

(71) Applicant: Panasonic Intellectual Property Management Co., Ltd., Osaka (JP)

(72) Inventors: Hiroharu Inoue, Osaka (JP); Koji Kishino, Mie (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/468,333

(22) Filed: Mar. 24, 2017

(65) Prior Publication Data

US 2017/0196082 A1    Jul. 6, 2017

Related U.S. Application Data

(63) Continuation of application No. 14/364,914, filed as application No. PCT/JP2012/007664 on Nov. 29, 2012, now Pat. No. 9,661,749.

(30) Foreign Application Priority Data

Dec. 16, 2011    (JP) .................. 2011-275787

(51) Int. Cl.
*H05K 1/00*        (2006.01)
*B32B 7/02*        (2006.01)
(Continued)

(52) U.S. Cl.
CPC ............. *H05K 1/036* (2013.01); *H05K 3/025* (2013.01); *H05K 2201/0212* (2013.01); *H05K 2201/068* (2013.01)

(58) Field of Classification Search
CPC .......... H05K 1/00; H05K 1/036; H05K 3/022; H05K 2201/068; H05K 3/4652; H05K 3/4644
(Continued)

(56) References Cited

U.S. PATENT DOCUMENTS 4,420,509 A * 12/1983 Barrell .................. B29C 70/50
427/206
4,446,173 A * 5/1984 Barrell .................. B29C 70/50
427/206
(Continued)

FOREIGN PATENT DOCUMENTS

CN    1929994 A    3/2007
JP    62-037151 A    2/1987
(Continued)

OTHER PUBLICATIONS

International Search Report issued in PCT/JP2012/007664 dated Dec. 25, 2012, with English translation.
(Continued)

*Primary Examiner* — Timothy Thompson
*Assistant Examiner* — Rhadames J Alonzo Miller
(74) *Attorney, Agent, or Firm* — McDermott Will & Emery LLP

(57) ABSTRACT

A metal-clad laminate according to the present embodiment includes an insulating layer, and a metal layer present on at least one surface side of the insulating layer. The insulating layer is a laminate of at least three layers of a center layer, a first resin layer present on one surface side of the center layer, and a second resin layer present on the other surface side of the center layer. The center layer, the first resin layer and the second resin layer each contain a cured product of a resin composition. Coefficients of thermal expansion of the cured products of the resin compositions contained in the
(Continued)

first resin layer and the second resin layer are smaller than a coefficient of thermal expansion of the cured product of the resin composition contained in the center layer.

9 Claims, 1 Drawing Sheet

(51) Int. Cl.
*H05K 1/03* (2006.01)
*H05K 3/02* (2006.01)

(58) Field of Classification Search
USPC .......................................... 174/250; 428/212
See application file for complete search history.

(56) References Cited

U.S. PATENT DOCUMENTS

| | | | | |
|---|---|---|---|---|
| 4,738,890 | A * | 4/1988 | Tohrin | B29B 15/10 428/196 |
| 4,803,022 | A * | 2/1989 | Barrell | B29C 35/12 156/275.5 |
| 4,937,133 | A * | 6/1990 | Watanabe | C08G 73/106 174/254 |
| 5,436,062 | A * | 7/1995 | Schmidt | H05K 1/115 174/254 |
| 6,720,077 | B2 * | 4/2004 | Hirai | B32B 15/08 252/601 |
| 7,087,296 | B2 * | 8/2006 | Porter | B29C 66/721 428/223 |
| 2002/0012780 | A1 * | 1/2002 | Yuyama | B32B 15/08 428/216 |
| 2003/0068520 | A1 * | 4/2003 | Ikegawa | H05K 1/0366 428/626 |
| 2005/0042466 | A1 * | 2/2005 | Ohno | C08G 65/485 428/457 |
| 2007/0042202 | A1 * | 2/2007 | Park | B32B 15/08 428/458 |
| 2007/0169886 | A1 * | 7/2007 | Watanabe | B32B 15/08 156/325 |
| 2009/0017308 | A1 * | 1/2009 | Kitano | C08J 5/24 428/414 |
| 2009/0101393 | A1 * | 4/2009 | Kim | B32B 15/08 174/254 |
| 2009/0312960 | A1 * | 12/2009 | Dang | G06F 17/5018 702/42 |
| 2010/0129676 | A1 * | 5/2010 | Fujimoto | B32B 15/14 428/462 |
| 2011/0074046 | A1 * | 3/2011 | Sunohara | H01L 23/49822 257/778 |
| 2011/0135911 | A1 * | 6/2011 | Maenaka | B32B 27/20 428/327 |
| 2011/0165410 | A1 * | 7/2011 | Aoyagi | B32B 15/08 428/325 |
| 2012/0243186 | A1 * | 9/2012 | Kim | B32B 15/08 361/750 |
| 2013/0037310 | A1 * | 2/2013 | Kimura | C08J 5/24 174/251 |
| 2013/0213696 | A1 * | 8/2013 | Yamamoto | H05K 3/386 174/254 |
| 2013/0242520 | A1 * | 9/2013 | Onozuka | B32B 5/02 361/783 |

FOREIGN PATENT DOCUMENTS

| | | |
|---|---|---|
| JP | H01-244841 A | 9/1989 |
| JP | 02-063821 A | 3/1990 |
| JP | H04-162487 A | 6/1992 |
| JP | H05-147152 A | 6/1993 |
| JP | 3818638 B2 | 9/2006 |
| JP | 2006-324654 A | 11/2006 |
| JP | 2007-123712 A | 5/2007 |
| JP | 2009-173017 A | 8/2009 |
| JP | 2009-214525 A | 9/2009 |
| JP | 2011-040728 A | 2/2011 |
| JP | 2011-235583 A | 11/2011 |

OTHER PUBLICATIONS

Notice of Allowance issued in U.S. Appl. No. 14/364,914 dated Nov. 14, 2014.
U.S. Office Action issued in U.S. Appl. No. 14/364,914 dated Apr. 24, 2015.
U.S. Office Action issued in U.S. Appl. No. 14/364,914 dated Aug. 21, 2015.
U.S. Office Action issued in U.S. Appl. No. 14/364,914 dated Jan. 14, 2016.
U.S. Office Action issued in U.S. Appl. No. 14/364,914 dated May 9, 2016.
U.S. Office Action issued in U.S. Appl. No. 14/364,914 dated Aug. 26, 2016.
U.S. Notice of Allowance issued in U.S. Appl. No. 14/364,914 dated Jan. 20, 2017.

\* cited by examiner

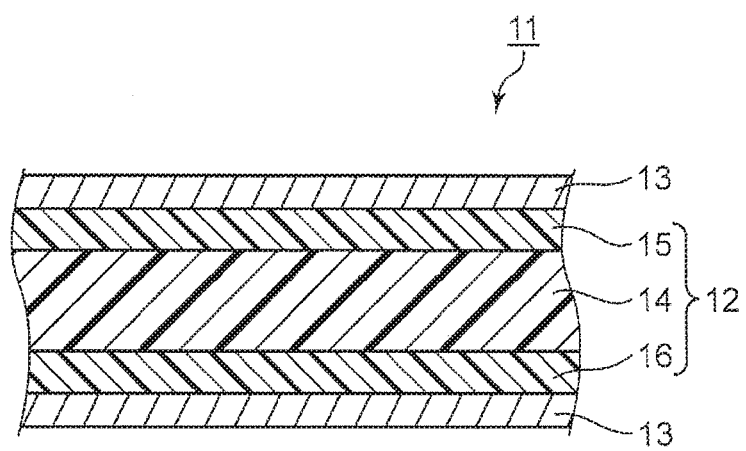

METAL-CLAD LAMINATE AND PRINTED WIRING BOARD

RELATED APPLICATIONS

This application is a Continuation of U.S. application Ser. No. 14/364,914, filed Jun. 12, 2014, which is the U.S. National Phase of International Application No. PCT/JP2012/007664, filed on Nov. 29, 2012, which in turn claims the benefit of Japanese Application No. 2011-275787, filed on Dec. 16, 2011, the disclosures of which are incorporated by reference herein.

TECHNICAL FIELD

The present invention relates to a metal-clad laminate, and a printed wiring board manufactured by using the metal-clad laminate.

BACKGROUND ART

Along with miniaturization and thinning of electronic devices, surface mount type packages, as electronic components to be provided in electronic devices, have come to be used in many cases. For the packages of such electronic components, there are packages which have substrates mounted with electronic components, such as semiconductor elements, and in which the electronic components resin-sealed. Specifically, there are semiconductor packages such as BOC (Board On Chip).

Further, along with miniaturization and thinning of electronic devices, miniaturization and thinning of electronic components provided in the electronic devices are also in progress. In order to provide electronic devices with multiple functions, it is necessary to increase the number of electronic components to be mounted on the electronic devices. In order to address this need as well, miniaturization and thinning of electronic components are in progress. Moreover, thinning of a substrate configuring a package of electronic components is also being implemented as it is being implemented in the electronic components.

Further, the package of the electronic component as described above has a structure of, for example, bimetal that has a sealing resin and a substrate bonded to each other. Such a package occasionally exhibited deformation such as warpage due to a difference in coefficient of thermal expansion (CTE) between the sealing resin and the substrate. In particular, thinner substrates exhibited warpage more often. Moreover, after implementing resin-sealing only on one side of the substrate, warpage was often identified in the substrate. Taking these into account, it is apparent that when electronic devices are used in an environment where temperature changes greatly, repetitive bending is exhibited due to warpage of the package of the electronic component. Therefore, due to the bending, deterioration such as cracks occurred near the surface of the substrate. Due to the deterioration of the substrate, damage such as disconnection of wiring on the substrate surface occurred.

Further, as a substrate used for a package of electronic components, for example, there is used a printed wiring board which is obtained by forming a circuit plate by partially removing a metal layer such as a metal foil arranged on the surface of a metal-clad laminate. As such a metal-clad laminate, there is a copper-clad laminate using a laminated board described in Patent Document 1, for example.

In Patent Document 1, there is described a laminated board that is formed by lamination by impregnating a bisphenol type epoxy resin composition into a sheet-shaped base material. In the laminated board, a sheet-shaped base material of a center layer is a glass fiber woven cloth, and a sheet-shaped base material of a surface layer is a nonwoven fabric of para-system aramid fiber. According to Patent Document 1, it is disclosed that the laminated board has an effect that surface mounting reliability of a chip component is excellent by making a coefficient of linear expansion of the surface layer close to a coefficient of linear expansion of the chip component to be mounted, and that dimensional shrinkage due to heating can be minimized.

Patent Document 1: Japanese Patent Application Publication No. H2-63821

SUMMARY OF THE INVENTION

An object of the present invention is to provide a metal-clad laminate with high reliability. Another object of the invention is to provide a printed wiring board manufactured by using the metal-clad laminate.

A metal-clad laminate according to one aspect of the present invention includes an insulating layer, and a metal layer present on at least one surface side of the insulating layer. The insulating layer is a laminate of at least three layers of a center layer, a first resin layer present on one surface side of the center layer, and a second resin layer present on the other surface side of the center layer. The center layer contains a cured product of a resin composition, and a fiber base material. The first resin layer and the second resin layer are formed of cured products of resin compositions, respectively. The resin composition in the center layer contains a thermosetting resin. A resin contained in the resin composition in the center layer is different from resins contained in the resin compositions in the first resin layer and the second resin layer. A coefficient of thermal expansion of the cured product of the resin composition contained in the first resin layer and a coefficient of thermal expansion of the cured product of the resin composition contained in the second resin layer are respectively smaller than a coefficient of thermal expansion of the cured product of the resin composition contained in the center layer.

Further, a printed wiring board according to another aspect of the present invention is obtained by forming a circuit by partially removing the metal layer of the metal-clad laminate.

The objects of the present invention, features, aspects, and advantages will become more apparent from the following detailed description and the accompanying drawings.

BRIEF DESCRIPTION OF THE DRAWING

FIG. 1 is a schematic sectional view showing an example of a metal-clad laminate according to the present embodiment.

BEST MODE FOR CARRYING OUT THE INVENTION

According to a study by the present inventors, there was a case where in a substrate formed by using a laminated board described in Patent Document 1, deformation such as warpage generated by temperature changes was not sufficiently suppressed.

Further, high reliability is required for metal-clad laminates. Fewer occurrences of warpage is not the only one, but, for example, fewer occurrences of molding defects such as thin spots and voids in an insulating layer are also required. On top of this, higher heat resistance is also demanded. According to the laminated board described in Patent Document 1, because the surface layer contains the nonwoven fabric of para-system aramid fiber, molding defects such as thin spots and voids easily occurred.

Therefore, the present inventors carried out various studies on the occurrence of warpage in the case where a substrate manufactured using a metal-clad laminate is used in an environment exhibiting a large temperature change, for example. As a result of the studies, first, it became clear that there would be fewer occurrences of warpage when the coefficient of thermal expansion of the metal-clad laminate is smaller. Further, it became clear that the coefficient of thermal expansion of the metal-clad laminate is greatly affected by the coefficient of thermal expansion of the region near the metal layer of the insulating layer. That is, it became clear that the suppression of generation of the warp is greatly affected by the coefficient of thermal expansion of the region near the metal layer of the insulating layer. From the results of the studies, the present inventors considered that decreasing of the coefficient of thermal expansion of the cured product of the resin composition contained at a position near the metal layer contributes to decrease the coefficient of thermal expansion of the metal-clad laminate more than decreasing of the coefficient of thermal expansion of the cured product of the resin composition contained in other portions and effectively works to suppress the occurrence of warpage, and carried out various studies. As a result, the present inventors reached the present invention as follows.

Hereinafter, an embodiment according to the present invention will be described. However, the present invention is not limited to the embodiment.

A metal-clad laminate according to the present embodiment includes an insulating layer, and a metal layer present on at least one surface side of the insulating layer. The insulating layer is a laminate of at least three layers of a center layer, a first resin layer present at one surface side of the center layer, and a second resin layer present at the other surface side of the center layer. The center layer contains a cured product of a resin composition, and a fiber base material. The first resin layer and the second resin layer consist of cured products of resin compositions, respectively. The resin composition in the center layer contains a thermosetting resin. A resin contained in the resin composition in the center layer is different from resins contained in the resin compositions in the first resin layer and the second resin layer. A coefficient of thermal expansion of the cured product of the resin composition contained in the first resin layer and a coefficient of thermal expansion of the cured product of the resin composition contained in the second resin layer are respectively smaller than a coefficient of thermal expansion of the cured product of the resin composition contained in the center layer.

According to such a configuration, a metal-clad laminate with high reliability can be obtained. A package of an electronic component obtained by using a substrate, such as a printed wiring board, formed with a circuit by partially removing a metal layer on the surface of the obtained metal-clad laminate can suppress occurrence of deformation of the substrate such as warpage, even when the package is used in an environment having a large temperature change. Further, based on this, the occurrence of damage such as the occurrence of cracks near the surface of the substrate can be suppressed sufficiently. This can be considered due to the following.

In the metal-clad laminate according to the present embodiment, the coefficients of thermal expansion of the cured products of the resin compositions contained in the first resin layer and the second layer arranged between the center layer and the metal layer are smaller than the coefficient of thermal expansion of the cured product of the resin composition contained in the center layer. That is, a coefficient of thermal expansion of a cured product of a resin composition contained in a resin layer at a metal layer side is smaller than a coefficient of thermal expansion of a cured product of a resin composition contained in a resin layer at a far side from the metal layer. From this, even when the center layer of the insulating layer is not a layer that can sufficiently lower the thermal expansion coefficient, the coefficient of thermal expansion of the metal-clad laminate obtained is considered to be able to be sufficiently lowered by arranging the first resin layer and the second resin layer between the center layer and the metal layer.

On the other hand, in order to decrease the coefficient of thermal expansion of the metal-clad laminate, it is considered suitable to change the cured product of the resin composition configuring the insulating layer to a resin that decreases the thermal expansion coefficient. However, there was a case where heat resistance could not be sufficiently ensured by only simply changing the resin contained in the resin composition configuring the insulating layer. Further, when a fiber base material was used in the center layer, impregnation into the fiber base material became insufficient by only simply changing the resin contained in the resin composition configuring the insulating layer. As a result, reliability was not able to be sufficiently secured due to the occurrence of molding defects such as thin spots and voids.

Further, when the coefficient of thermal expansion of the cured product of the resin composition contained in the center layer is equal to or smaller than the coefficient of thermal expansion of the cured product of any resin composition contained in the first resin layer and the second resin layer, there is a case that the reliability of the obtained metal-clad laminate does not become sufficiently high. This is considered because the coefficient of thermal expansion of the obtained metal-clad laminate is not sufficiently small.

The thermal expansion coefficient is a rate of expansion of a length of an object due to a rise in temperature, expressed by a value per 1° C., such as a thermal expansion coefficient measured by a TMA (Thermo-mechanical analysis) method, for example. More specifically, there is a thermal expansion coefficient measured by the TMA method in a temperature range of 40° C. to 125° C.

Further, when the center layer contains a fiber base material as well as the cured product of the resin composition, it is considered possible to improve insulation reliability and flexibility. Also from this, it is considered possible to manufacture an electronic component with high reliability. This is considered because of the following. When the center layer contains a fiber base material as well as the cured product of the resin composition, it is considered possible to improve insulation reliability and flexibility. That is, when a fiber base material is not contained, at the time of bending the obtained metal-clad laminate, there is a tendency of occurrence of an inconvenience such as cracking. From this, it is considered possible to manufacture an electronic component with higher reliability.

From the above, it is considered possible to obtain a metal-clad laminate with high reliability.

There are no other particular limits, so long as the metal-clad laminate according to the present embodiment satisfies the above configuration. Specifically, there is a metal-clad laminate having a layer structure as shown in FIG. 1. FIG. 1 is a schematic sectional view showing an example of a metal-clad laminate 11 according to the present embodiment.

For the metal-clad laminate according to the present embodiment, there is a metal-clad laminate that includes an insulating layer 12, and a metal layer 13 that is present on the surfaces of the insulating layer 12, as shown in FIG. 1. The insulating layer 12 includes laminated three layers of a center layer 14, a first resin layer 15 present at one surface side of the center layer 14, and a second resin layer 16 present at the other surface side of the center layer 14.

The insulating layer 12 may include the first resin layer 15, the center layer 14, and the second resin layer 16 in this order, and may include other layers. Specifically, the insulating layer 12 may include an intermediate layer for the purpose of increasing adhesion between the metal layer 13 and the insulating layer 12, on surface layers of the first resin layer 15 and the second resin layer 16. The surface layers of the first resin layer 15 and the second resin layer 16 are between the first resin layer 15 and the metal layer 13 and between the second resin layer 16 and the metal layer 13. Also, other layer may be included between the first resin layer 15 and the center layer 14. However, preferably, the first resin layer 15 is laminated directly on the center layer 14. By this arrangement, a metal-clad laminate with higher reliability can be obtained. This is considered attributable to the presence of the first resin layer 15 that contributes to lowering the coefficient of thermal expansion of the metal-clad laminate 11 and more effective suppression of the occurrence of warpage. Also, other layer may be included between the second resin layer 16 and the center layer 14. However, for a reason similar to that of the case of the first resin layer 15 and the center layer 14, preferably, the second resin layer 16 is laminated directly on the center layer 14.

The insulating layer in the present embodiment is not particularly limited, so long as at least three layers are laminated including the center layer, the first resin layer present at one surface side of the center layer, and the second resin layer present at the other surface side of the center layer, as described above.

The thickness of the insulating layer is not particularly limited, and is preferably between 20 μm and 250 μm. When the insulating layer is too thin, there is a tendency that a printed wiring board formed by partially removing the metal layer becomes too thin and mechanical strength and the like become insufficient. Further, when the insulating layer is too thick, there is a tendency that it becomes difficult to manufacture a metal-clad laminate. When the insulating layer is too thick, the metal-clad laminate becomes also thick, and this inhibits miniaturization and thinning of the substrate obtained from the metal-clad laminate and a package of the electronic components and the like finally obtained. Therefore, when the thickness of the insulating layer is within the range, it is considered possible to avoid inhibiting miniaturization and thinning of the substrate obtained from the metal-clad laminate and the package of the electronic components and the like finally obtained, and sufficiently inhibit reduction of mechanical strength and like due to a too small thickness.

Thicknesses of the center layer, the first resin layer, the second resin layer, the insulating layer, and the metal-clad laminate can be measured by microscopic observation of the cross-section of the metal-clad laminate.

Further, the center layer in the insulating layer is not particularly limited, so long as the above configuration is satisfied. More specifically, the center layer in the insulating layer is not limited, so long as the following configuration is satisfied. First, the center layer in the insulating layer contains a cured product of the resin composition and the fiber base material. The resin composition contains a thermosetting resin. The resin contained in the resin composition in the center layer is different from the resin contained in the resin composition of the first resin layer and the second resin layer. Further, a relationship is satisfied that the coefficient of thermal expansion of the cured product of the resin composition contained in the first resin layer, and the coefficient of thermal expansion of the cured product of the resin composition contained in the second resin layer are respectively smaller than the coefficient of thermal expansion of the cured product of the resin composition contained in the center layer. That is, the coefficient of thermal expansion of the cured product of the resin composition contained in the center layer is equal to or larger than the coefficients of thermal expansion of the cured product of the resin composition contained in the first resin layer and the cured product of the resin composition contained in the second resin layer, respectively. Therefore, the center layer is not particularly limited, so long as the above condition is satisfied.

Further, for the resin composition in the center layer, as a relationship to be satisfied, the coefficient of thermal expansion of the cured product of the resin composition contained in the first resin layer and the coefficient of thermal expansion of the cured product of the resin composition contained in the second resin layer are preferably between 5% and 90%, more preferably between 10% and 80%, and further preferably between 10% and 70%, respectively, of the coefficient of thermal expansion of the cured product of the resin composition contained in the center layer. As the resin composition in the center layer, when the coefficient of thermal expansion of the cured product of the resin composition contained in the center layer is not so large as compared with the coefficient of thermal expansion of the cured product of the resin composition contained in the first resin layer and the coefficient of thermal expansion of the cured product of the resin composition contained in the second resin layer, the coefficient of thermal expansion of the cured product of the resin composition contained in the center layer becomes close to the coefficient of thermal expansion of the cured product of the resin composition contained in the first resin layer and the coefficient of thermal expansion of the cured product of the resin composition contained in the second resin layer. Therefore, there is a tendency that reliability cannot be sufficiently increased. This is considered because the effect of suppressing the occurrence of warpage by lowering the coefficient of thermal expansion of the metal-clad laminate based on the presence of the first resin layer and the second resin layer cannot be sufficiently exhibited. Further, when the coefficient of thermal expansion of the cured product of the resin composition contained in the first resin layer and the coefficient of thermal expansion of the cured product of the resin composition contained in the second resin layer are smaller than the coefficient of thermal expansion of the cured product of the resin composition contained in the center layer, it is considered that the effect of suppressing the occurrence of warpage by lowering the coefficient of thermal expansion of the metal-clad laminate based on the presence of the first resin layer and the second resin layer becomes higher. However, in practice, there is a limit to these differences. The coefficient of thermal expansion of the cured product of the resin composition contained in the first resin layer and the coefficient of thermal expansion of the cured product of the resin composition contained in the second resin layer are considered to be about 5% of the coefficient of thermal expansion of the cured product of the resin composition contained in the center layer. This ratio is a minimum ratio. Therefore, 5% is set as a lower limit. Further, when the coefficient of thermal expansion of the cured product of the resin composition contained in the center layer is too small or too large as compared with the coefficient of thermal expansion of the cured product of the resin composition contained in the first resin layer and the coefficient of thermal expansion of the cured product of the resin composition contained in the second resin layer, the coefficient of thermal expansion of the cured product of the resin composition contained in the center layer becomes too far from the coefficient of thermal expansion of the cured product of the resin composition contained in the first resin layer and the coefficient of thermal expansion of the cured product of the resin composition contained in the second resin layer. Therefore, there is a tendency that peel easily occurs between the center layer and the first resin layer, and between the center layer and the second resin layer.

Further, the coefficient of thermal expansion of the cured product of the resin composition contained in the center layer in a temperature range of 40° C. to 125° C. is preferably between 5 ppm/° C. and 70 ppm/° C., more preferably between 10 ppm/° C. and 60 ppm/° C., and further preferably between 15 ppm/° C. and 50 ppm/° C. There is a tendency that when the coefficient of thermal expansion of the cured product of the resin composition contained in the center layer is too small, reliability of the metal-clad laminate obtained cannot be sufficiently increased. This results in that the coefficient of thermal expansion of the cured product of the resin composition contained in the center layer has a small difference from the coefficient of thermal expansion of the cured product of the resin composition contained in the first resin layer and the coefficient of thermal expansion of the cured product of the resin composition contained in the second resin layer, and this is considered because the effect of suppressing the occurrence of warpage by lowering the coefficient of thermal expansion of the metal-clad laminate based on the presence of the first resin layer and the second resin layer cannot be sufficiently exhibited. Further, when the coefficient of thermal expansion of the cured product of the resin composition contained in the center layer is too large, the coefficient of thermal expansion of the cured product of the resin composition contained in the center layer becomes too different from the coefficient of thermal expansion of the cured product of the resin composition contained in the first resin layer and the coefficient of thermal expansion of the cured product of the resin composition contained in the second resin layer, and there is a tendency that peel easily occurs between the center layer and the first resin layer, and between the center layer and the second resin layer.

The fiber base material is not particularly limited, and there is a sheet-shaped fiber base material, for example. As concrete examples of the fiber base material, there are examples of glass cloth such as woven fabric of inorganic fiber, nonwoven fabric of inorganic fiber, aramid cloth, polyester cloth, and paper, for example. A thickness of the fiber base material is not particularly limited, and is preferably, about 0.01 mm to 0.2 mm, for example.

Further, the resin composition in the center layer is not particularly limited, so long as that the resin composition satisfies the above relationship, that the resin composition is thermosetting, and that the resin contained in the resin composition in the center layer is different from the resins contained in the first resin layer and the second resin layer.

Specifically, for example, the resin composition in the center layer is an epoxy resin composition that contains an epoxy compound, and a curing agent and a curing accelerator for curing the epoxy compound.

Such an epoxy compound is not particularly limited, and there is an epoxy compound having two or more epoxy groups in one molecule, for example. More specifically, there are bisphenol epoxy resins, novolak epoxy resins, phenol novolak type epoxy resins, alicyclic epoxy resins, and heterocyclic epoxy resins, for example. These resins can be used alone, or may be used in combination of two or more types.

The curing accelerator to be used is not particularly limited. Specifically, a curing accelerator is a substance that can accelerate the curing of epoxy compounds, and there are imidazole compounds, for example.

Further, the resin composition in the center layer preferably contains a radical polymerization type thermosetting compound. By doing so, a metal-clad laminate with high reliability can be provided. This is considered because of the following.

First, because the radical polymerization type thermosetting compound is included for the resin composition in the center layer, it is considered possible to suitably cure the resin composition in the center layer and form a suitable center layer. Further, when the center layer contains a fiber base material such as glass cloth, the center layer is considered to be a layer obtained by impregnating a resin composition into the fiber base material and by curing the resin composition. In this case, when the radical polymerization type thermosetting compound is contained as the resin composition in the center layer, it is considered possible to form a more suitable center layer with excellent impregnation of the resin composition into the fiber base material. From these facts, it is considered possible to provide a metal-clad laminate with higher reliability. Further, by the inclusion of the radical polymerization type thermosetting compound, it is considered possible to have the resin composition more suitably cured in the center layer and perform a continuous manufacturing of the metal-clad laminate.

Such a radical polymerization type thermosetting compound is not particularly limited. For the radical polymerization type thermosetting compound, there are a radical polymerization type thermosetting monomer and a radical polymerization type thermosetting resin.

For the radical polymerization type thermosetting monomer, there are monomers having at least one radically polymerizable unsaturated group in one molecule. More specifically, for example, there are styrene, methylstyrene, halogenated styrene, (meth) acrylic acid, methyl methacrylate, ethyl methacrylate, butyl acrylate, divinylbenzene, ethylene glycol di (meth) acrylate, propylene glycol di (meth) acrylate, trimethylolpropane tri (meth) acrylate, pentaerythritol tri (meth) acrylate, pentaerythritol tetra (meth) acrylate. These can be used alone, or may be used in combination of two or more kinds.

Further, for the radical polymerization type thermosetting resin, there are resins having at least two radically polymerizable unsaturated group in one molecule, for example. Specifically, for example, there are a vinyl ester resin as a reaction product of an epoxy resin with an unsaturated fatty acid such as acrylic acid and methacrylic acid, an unsaturated polyester as a reaction product of propylene glycol, bisphenol A propylene oxide adduct and the like with polybasic unsaturated acids such as maleic acid and fumaric acid and the like, and bisphenol A type methacrylate. These can be used alone, or may be used in combination of two or more types.

In the case of using such a radical polymerization type thermosetting compound, it is preferable that a radical polymerization agent is contained in the resin composition. Concrete examples of the radical polymerization initiator are organic peroxides and inorganic peroxide such as hydrogen peroxide, that are ketone peroxides such as methyl ethyl ketone peroxide, methyl isobutyl ketone peroxide, and cyclohexanone peroxide, dialkyl peroxides such as benzoyl peroxide and isobutyl peroxide, hydroperoxides such as cumene hydroperoxide and t-butyl hydroperoxide, dialkyl peroxides such as dicumyl peroxide and di-t-butyl peroxide, peroxy ketals such as 1, 1-di-t-butylperoxy-3, 3, 5-trimethyl cyclohexanone, and 2, 2-di-(t-butylperoxy)-butane, alkyl peresters such as t-butyl perbenzoate, t-butyl peroxy-2-ethylhexanoate, and carbonates such as bis (4-t-butyl cyclohexyl) peroxy dicarbonate and t-butyl peroxy isobutyl carbonate. These can be used alone, or may be used in combination of two or more kinds, for example.

The resin composition in the center layer may contain an elastomer, an inorganic filler, and the like.

The elastomer is not particularly limited, and there are low-volatile liquid rubbers such as liquid polybutadiene and liquid NBR, and non-crosslinkable or crosslinked rubber particles such as NBR rubber, SBR rubber, acrylic rubber, and silicone rubber, for example.

The inorganic filler is not particularly limited, and there are silica such as spherical silica, alumina and aluminium hydroxide, for example. For the content of the inorganic filler, preferably, the coefficient of thermal expansion of the cured product of the resin composition contained in the center layer is an amount satisfying the relationship described above.

The resin composition in the center layer is preferably a liquid resin composition. That is, the epoxy compound and radical polymerization type thermosetting compound that can be contained in the resin composition are liquids. By doing so, a metal-clad laminate with higher reliability can be provided. This is considered attributable to the following fact.

First, by using the liquid resin composition for the resin composition in the center layer, it is considered possible to form a suitable center layer with, for example, a smooth surface. Further, when the center layer contains a fiber base material such as glass cloth, the center layer is considered to be a layer obtained by impregnating a resin composition into the fiber base material and by curing the impregnated resin composition. In this case, when a liquid resin composition is used as the resin composition in the center layer, it is considered possible to form a more suitable center layer with excellent impregnation of the resin composition into the fiber base material. From these facts, it is considered possible to provide a metal-clad laminate with higher reliability. Further, by using a liquid resin composition as the resin composition in the center layer, a continuous manufacturing of the metal-clad laminate could be more easily implemented.

Further, preferably, the resin composition in the center layer does not contain a solvent. That is, preferably, the resin composition in the center layer is a resin composition without solvent. If so, a metal-clad laminate can be continuously manufactured.

Further, the first resin layer and the second resin layer in the insulating layer are not particularly limited, so long as these resin layers satisfy the above configuration. Specifically, the first resin layer and the second resin layer are not particularly limited when the condition is satisfied that the resin is consisting of a cured product of a resin composition and the resin contained in the resin composition is different from the resin contained in the resin composition in the center layer, and that the coefficient of thermal expansion of the cured product of the resin composition contained in the first resin and the coefficient of thermal expansion of the cured product of the resin composition contained in the second resin are respectively smaller than the coefficient of thermal expansion of the cured product of the resin composition contained in the center layer. This relationship is that a larger one of the coefficient of thermal expansion of the cured product of the resin composition contained in the first resin and the coefficient of thermal expansion of the cured product of the resin composition contained in the second resin is smaller than the coefficient of thermal expansion of the cured product of the resin composition contained in the center layer.

Further, the first resin layer and the second resin layer may be layers of the same composition, or may be a layer of a different composition, so long as the first resin layer and the second resin layer satisfy the above relationship.

Further, the resin compositions of the first resin layer and the second resin layer are not particularly limited, so long as the coefficients of thermal expansion of respective cured products thereof are smaller than the coefficient of thermal expansion of the resin composition contained in the center layer.

Further, the coefficient of thermal expansion of the cured product of the resin composition contained in the first resin and the coefficient of thermal expansion of the cured product of the resin composition contained in the second resin in a temperature range of 40° C. to 125° C. are preferably between 3 ppm/° C. and 40 ppm/° C., more preferably between 5 ppm/° C. and 35 ppm/° C., and further preferably between 5 ppm/° C. and 30 ppm/° C. When the coefficient of thermal expansion of the cured product of the resin composition contained in the first resin layer and the coefficient of thermal expansion of the cured product of the resin composition contained in the second resin layer become too small, a difference between the coefficient of thermal expansion of the cured product of the resin composition contained in the first resin layer and the coefficient of thermal expansion of the cured product of the resin composition contained in the second resin layer becomes too large, and there is a tendency that peel easily occurs between the center layer and the first resin layer, and between the center layer and the second resin layer. Further, it is realistically difficult to set the coefficient of thermal expansion of the cured product of the resin composition contained in the first resin layer and the coefficient of thermal expansion of the cured product of the resin composition contained in the second resin layer to less than 3 ppm/° C. When the coefficient of thermal expansion of the cured product of the resin composition contained in the first resin layer and the coefficient of thermal expansion of the cured product of the resin composition contained in the second resin layer are too large, there is a tendency that it is not possible to sufficiently increase the reliability of the obtained metal-clad laminate. Resultantly, the difference between the coefficient of thermal expansion of the cured product of the resin composition contained in the first resin layer and the coefficient of thermal expansion of the cured product of the resin composition contained in the second resin layer becomes too small and this is considered because the effect of suppressing the occurrence of warpage by lowering the coefficient of thermal expansion of the metal-clad laminate based on the presence of the first resin layer and the second resin layer cannot be sufficiently exhibited.

Therefore, when the coefficient of thermal expansion of the cured product of the resin composition contained in the first resin layer and the coefficient of thermal expansion of the cured product of the resin composition contained in the second resin layer are within the above range, a metal-clad laminate with higher reliability can be provided. This is considered attributable to that the effect of suppressing the occurrence of warpage can be exhibited by lowering the coefficient of thermal expansion of the metal-clad laminate based on the presence of the first resin layer and the second resin layer.

Further, the resin compositions of the first resin layer and the second resin layer are not particularly limited, so long as the resin compositions satisfy the above relationship and the resin compositions are different from the resin component in the center layer. Specifically, for example, there are a resin composition or the like that contains a base resin, and a curing agent and a curing accelerator for curing the base resin. For the base resin, there are epoxy compounds such as epoxy resins, and thermosetting compounds containing imide skeleton in the molecule, and the like. Among these compounds, the thermosetting compound containing imide skeleton in the molecule is preferably used. That is, the resin compositions of the first resin layer and the second resin layer are preferably resin compositions containing a thermosetting compound containing an imide skeleton in the molecule. By using such compositions, for the resin compositions contained in the first resin layer and the second resin layer, the coefficients of thermal expansion of the cured products of the resin compositions more easily satisfy the above relationship, and it becomes possible to provide a metal-clad laminate with higher reliability.

The thermosetting compound containing an imide skeleton in the molecule is not particularly limited, so long as the imide skeleton is contained in the molecule, and after the thermosetting compound is cured by the curing agent or the like, the compound serves as a thermosetting resin. For example, there are a bisallylnadimide compound and polyimide resin. By using such a thermosetting compound, imide skeleton is contained in the cured product. Based on this, it is considered possible to obtain a cured product of a smaller coefficient of thermal expansion than that of the cured product of the resin composition contained in the center layer.

Further, the epoxy compound is not particularly limited. For example, there is preferably used an epoxy compound that can become a cured product of a smaller coefficient of thermal expansion than that of the cured product of the resin composition contained in the center layer and that has two or more epoxy groups in one molecule. More specifically, there are epoxy resins such as cresol novolak type epoxy resins, bisphenol F type epoxy resins, phenol novolak type epoxy resins, dicyclopentadiene type epoxy resins, biphenyl type epoxy resins, naphthalene type epoxy, bisphenol A type epoxy resins, phenol aralkyl type epoxy resins, for example. These epoxy resins can be used alone or may be used in combination of two or more types.

Further, the curing agent is not particularly limited. Specifically, there are cured products that cure the base resin, and that have a smaller coefficient of thermal expansion than that of the cured product of the resin composition contained in the center layer. More specifically, there are curing agents containing an imide skeleton in the molecule, when a thermosetting compound containing an imide skeleton in the molecule is used for a base resin, for example. For the curing agent having an imide skeleton in the molecule, there are curing agents having a maleimide group in the molecule, and more specifically, phenylmethane maleimide compounds, for example. Further, when an epoxy compound is used for a base resin, there are phenolic curing agents such as phenol novolak type resins, for example.

Further, the curing accelerators are not particularly limited. Specifically, there are curing accelerators that can accelerate the curing of epoxy compounds, such as imidazole compounds, for example.

Further, the resin compositions of the first resin layer and the second resin layer may contain an inorganic filler or the like. The inorganic filler is not particularly limited, and there are silica such as spherical silica, alumina, and aluminum hydroxide, for example. Further, for the content of the inorganic filler, preferably, the content is a level at which the coefficient of thermal expansion of the cured product of the resin composition contained in the first resin layer and the coefficient of thermal expansion of the cured product of the resin composition contained in the second resin layer satisfy the above relationship.

It is sufficient that the first resin layer and the second resin layer contain at least the cured product of the resin composition described above, and the first resin layer and the second resin layer may not contain the fiber base material. That is, the first resin layer and the second resin layer may be layers consisting of a cured product of the resin composition. Preferably, the first resin layer and the second resin layer are layers consisting of a cured product of the resin composition.

Further, the thickness of the first resin layer and the thickness of the second resin layer are preferably between 5% and 100%, more preferably between 5% and 80%, and further preferably between 5% and 50%, respectively of the thickness of the center layer. Specifically, the thickness of the first resin layer and the thickness of the second resin layer are between 1 µm and 25 µm, more preferably between 1 µm and 20 µm, and further preferably between 1 µm and 15 µm, respectively. By setting the thicknesses of the first resin layer and the second resin layer to the above, a metal-clad laminate with higher reliability can be provided. This is considered attributable to that the effect of suppressing the occurrence of warpage can be exhibited by lowering the coefficient of thermal expansion of the metal-clad laminate based on the presence of the first resin layer and the second resin layer. The thickness of the center layer preferably satisfies the above relationship. Specifically, the thickness is preferably between 20 µm and 230 µm, more preferably between 20 µm and 200 µm, and further preferably between 20 µm and 150 µm.

The metal layer of the metal-clad laminate is not particularly limited. Specifically, there is a metal foil or the like which can be used as a metal layer of the metal-clad laminate. Further, for the metal foil, there is copper foil such as electrolytic copper foil. The thickness of the metal foil is not particularly limited, and is preferably between 2 µm and 35 µm. Further, as a specific example of the metal layer, there is electrolytic copper foil (3EC-VLP, thickness 12 µm manufactured by Mitsui Mining & Smelting Co., Ltd.), for example.

Further, for the metal-clad laminate, a metal layer may be arranged on one surface of the insulating layer, or may be arranged on both sides of the insulating layer, preferably on both sides of the insulating layer. By doing so, by partially removing a metal layer on the surface, a substrate on both sides of which metal wirings are formed can be formed. A metal-clad laminate on both surfaces of which a metal wiring can be formed can also obtain high reliability. By manufacturing an electronic component using such a metal-clad laminate, the electronic components with high reliability can be manufactured.

Preferably, the metal-clad laminate obtained in this way has a small coefficient of thermal expansion, from the viewpoint of suppressing the occurrence of warpage and obtaining high reliability. Specifically, the coefficient of thermal expansion of the metal-clad laminate in a temperature range of 40° C. to 125° C. is preferably 20 ppm/° C. or less. The metal-clad laminate has preferably a small coefficient of thermal expansion. However, in practice, about 1 ppm/° C. is the limit. Therefore, the coefficient of thermal expansion of the metal-clad laminate in the temperature range of 40° C. to 125° C. is preferably between 1 ppm/° C. and 20 ppm/° C., more preferably between 1 ppm/° C. and 18 ppm/° C., and further preferably between 1 ppm/° C. and 15 ppm/° C.

Further, a manufacturing method of the metal-clad laminate is not particularly limited, so long as a metal-clad laminate having the above configuration can be manufactured. Specifically, there is the following method, for example.

First, a resin composition in the center layer is impregnated with a fiber base material. The impregnation can be performed by dipping or coating, for example. By doing so, a prepreg for forming the center layer can be obtained.

Then, a resin composition of the first resin layer is coated on the metal foil that becomes the metal layer. The metal foil coated with the resin composition is laminated so that the resin composition is brought into contact with one surface of the prepreg for forming the center layer. Further, the resin composition of the second resin layer is coated on the metal foil that becomes the metal layer. The metal foil coated with the resin composition is laminated so that the resin composition is brought into contact with the other surface of the prepreg for forming the center layer.

Thereafter, the laminate including the prepreg is heated. By doing so, the resin composition contained in each layer is thermally cured, and the metal-clad laminate is obtained.

For the first resin layer and the second resin layer, a method of applying the resin composition configuring the resin layers first to the metal foil has been described. However, the method is not limited to this, and the following method may be used, for example. Specifically, first, resin compositions configuring the first resin layer and the second resin layer are applied first to the prepreg for forming the center layer, not to the metal foil. The metal foil may be laminated to both sides of the prepreg that have been coated.

Further, the metal-clad laminate obtained can be set as a printed wiring board, by forming a circuit by etching the metal layer by etching or the like. That is, by forming a circuit by etching the metal layer of the metal-clad laminate obtained, a printed wiring board provided with a conductive pattern as a circuit on the surface of the laminate can be obtained. The printed wiring board thus obtained is highly reliable as this board exhibits fewer occurrences of warpage and the like.

The present invention will be described below in detail based on examples. However, the present invention is not limited to these examples.

EXAMPLES

Example 1

First, for the resin composition in the center layer, there were prepared a resin component consisting of 35 parts by mass of bisphenol A methacrylate (NK oligo EA1020 manufactured by Shin-Nakamura Chemical Co., Ltd.), 35 parts by mass of phenol novolak type epoxy resin (EPICLON N740, epoxy resin containing two or more epoxy groups in one molecule, manufactured by DIC Corporation Ltd.), 30 parts by mass of styrene (manufactured by Nippon Steel Chemical Co., Ltd.) as a radical polymerization type thermosetting monomer, one part by mass of cumene hydroperoxide (CHP) (Percumyl H-80 manufactured by NOF Co., Ltd.) as a radical polymerization initiator, one part by mass of 2-ethyl-4-methylimidazole (2E4MZ) (manufactured by Shikoku Kasei Co., Ltd.) as a curing accelerator, 75 parts by mass of aluminum hydroxide particles (CL303 manufactured by Sumitomo Chemical Co., Ltd.) as an inorganic filler, 65 parts by mass of silica particles (SO25R manufactured by Admatechs Co. Ltd.) as an inorganic filler, and 18 pars by mass of cyclic phosphazene compound (SPB100 manufactured by Otsuka Chemical Co., Ltd.). Then, as a prepreg for forming the center layer, there was prepared a prepreg (resin-impregnated base material) having the above resin composition impregnated into glass cloth (1037 type, one plain weave).

For the metal foil that becomes the metal layer, there was prepared electrolytic copper foil (3EC-VLP, thickness 12 μm, manufactured by Mitsui Mining & Smelting Co., Ltd.).

Further, for the resin composition of the first resin layer, there was prepared a resin composition consisting of 50 parts by mass of a thermosetting compound containing an imide skeleton in the molecule (BANI-M manufactured by Maruzen Petrochemical Co., Ltd.), 50 parts by mass of a curing agent containing the imide skeleton in the molecule (BMI 2300, phenylmethane maleimide manufactured by Yamato Chemical Industry Co., Ltd.), 300 parts by mass of silica particles (SO25R manufactured by Admatechs Co. Ltd.) as an inorganic filler, and 15 parts by mass of aluminum hydroxide particles (CL303 manufactured by Sumitomo Chemical Co., Ltd.) as an inorganic filler. At the time of forming the first resin layer, methyl ethyl ketone (MEK) was added to the resin composition so that a solid content concentration became 60 mass percent.

Further, for the resin composition of the second resin layer, a resin composition similar to the resin composition of the first resin layer was prepared. Then, at the time of forming the second resin layer, in a similar manner to that of forming the first resin layer, MEK was added to the resin composition so that a solid content concentration became 60 mass percent, and the resin composition was used in a varnish shape.

The resin composition of the first resin layer was coated to the metal foil to have a thickness of 10 μm.

The resin composition of the second resin layer was coated to another metal foil to have a thickness of 10 μm.

The metal foils coated with the resin compositions were laminated so that the resin compositions were brought into contact with respective surfaces of the prepreg for forming the center layer.

Thereafter, the obtained laminate was dried at 100° C. for 15 minutes, and thereafter, was heated at 200° C. for 15 minutes.

By doing so, the resin composition contained in each layer was thermally cured, and a metal-clad laminate was obtained.

In the metal-clad laminate thus obtained, the coefficient of thermal expansion (CTE) of the cured product of the resin composition contained in the center layer was 47 ppm/° C., the coefficient of thermal expansion of the cured product of the resin composition contained in the first resin layer was 16 ppm/° C., and the coefficient of thermal expansion of the cured product of the resin composition contained in the second resin layer was 16 ppm/° C. The respective coefficients of thermal expansion are coefficients of thermal expansion of the cured products obtained by curing the resin compositions configuring the respective layers to become in predetermined shapes such as separate plate-shapes.

The cured products obtained from the resin compositions configuring the respective layers were measured in a temperature range of 40° C. to 125° C., by the TMA method, based on JIS C 6481. More specifically, the measurement was performed by a tensile testing method using the TMA/SS6100 manufactured by Seiko Instruments Inc. Moreover the measurement was performed in a condition of a temperature range of 30° C. to 280° C., at a heating rate of 10° C./min, and a coefficient of thermal expansion in the temperature range was obtained, based on a measurement result in a temperature range of 40° C. to 125° C.

Thicknesses of the center layer, the first resin layer, the second resin layer, and the metal-clad laminate were 40 μm, 10 μm, 10 μm, and 84 μm, respectively. Each thickness was measured by microscopic observation of the cross section of the obtained metal-clad laminate.

Example 2

Example 2 is similar to Example 1, except that for the resin composition of the first resin layer and the resin composition of the second resin layer, there was used a resin composition consisting of 50 parts by mass of a thermosetting compound containing an imide skeleton in the molecule (V8005, imide resin manufactured by DIC Corporation Ltd.), 50 parts by mass of epoxy resin containing naphthalene skeleton in the molecule (EXA9500 manufactured by DIC Corporation Ltd.), two parts by mass of 2-ethyl-4-methyl imidazole as a curing accelerator (2E4MZ) (manufactured by Shikoku Kasei Co., Ltd.), and 300 parts by mass of silica particles (SO25R manufactured by Admatechs Co., Ltd.) as an inorganic filler.

In the metal-clad laminate thus obtained, the coefficient of thermal expansion of the cured product of the resin composition contained in the center layer was 47 ppm/° C., the coefficient of thermal expansion of the cured product of the resin composition contained in the first resin layer was 18 ppm/PC, and the coefficient of thermal expansion of the cured product of the resin composition contained in the second resin layer was 18 ppm/° C.

Example 3

Example 3 is similar to Example 1, except that for the resin composition of the first resin layer and the resin composition of the second resin layer, there was used a resin composition consisting of 67 parts by mass of cresol novolak type epoxy resin (N690 manufactured by DIC Corporation Ltd.), 33 parts by mass of a phenol curing agent (TD2090 manufactured by DIC Corporation), one part by mass of 2-ethyl-4-methylimidazole (2E4MZ) (manufactured by Shikoku Kasei Co., Ltd.) as a curing accelerator, and 300 parts by mass of silica particles (SO25R manufactured by Admatechs Co., Ltd.) as an inorganic filler.

In the metal-clad laminate thus obtained, the coefficient of thermal expansion of the cured product of the resin composition contained in the center layer was 47 ppm/° C., the coefficient of thermal expansion of the cured product of the resin composition contained in the first resin layer was 21 ppm/° C., and the coefficient of thermal expansion of the cured product of the resin composition contained in the second resin layer was 21 ppm/° C.

Example 4

Example 4 is similar to Example 3, except that for the resin composition of the first resin layer and the resin composition of the second resin layer, there was used a resin composition, whose content of silica particles (SO25R manufactured by Admatechs Co., Ltd.), as an inorganic filler, was changed from 300 parts by mass to 70 parts by mass.

In the metal-clad laminate thus obtained, the coefficient of thermal expansion of the cured product of the resin composition contained in the center layer was 47 ppm/° C., the coefficient of thermal expansion of the cured product of the resin composition contained in the first resin layer was 40 ppm/° C., and the coefficient of thermal expansion of the cured product of the resin composition contained in the second resin layer was 40 ppm/° C.

Example 5

Example 5 is similar to Example 3, except that in manufacturing the center layer, a metal-clad laminate was manufactured by using glass cloth (3313 type, two plain weaves) in place of the glass cloth (1037 type, one plain weave) so that a thickness of the center layer became 180 μm.

Example 6

Example 6 is similar to Example 1, except that in manufacturing the center layer, a metal-clad laminate was manufactured by using glass cloth (1027 type, one plain weave) in place of the glass cloth (1037 type, one plain weave) so that a thickness of the center layer became 30 μm, and thicknesses of the first resin layer and the second resin layer became 15 μm and 15 μm, respectively.

Example 7

Example 7 is similar to Example 3, except that for the resin composition of the first resin layer and the resin composition of the second resin layer, there was used a resin composition whose content of silica particles (SO25R manufactured by Admatechs Co., Ltd.), as an inorganic filler, was changed from 300 parts by mass of to 40 parts by mass.

In the metal-clad laminate thus obtained, the coefficient of thermal expansion of the cured product of the resin composition contained in the center layer was 47 ppm/° C., the coefficient of thermal expansion of the cured product of the resin composition contained in the first resin layer was 45 ppm/° C., and the coefficient of thermal expansion of the cured product of the resin composition contained in the second resin layer was 45 ppm/° C.

Example 8

Example 8 is similar to Example 3, except that in manufacturing the center layer, a metal-clad laminate was manufactured by using glass cloth (3313 type, two plain weaves) in place of the glass cloth (1037 type, one plain weave) so that a thickness of the center layer became 210 μm, and thicknesses of the first resin layer and the second resin layer became 25 μm and 25 μm, respectively.

Example 9

Example 9 is similar to Example 3, except that in manufacturing the center layer, a metal-clad laminate was manufactured by using glass cloth (3313 type, two plain weaves) in place of the glass cloth (1037 type, one plain weave) so that a thickness of the center layer became 190 μm, and Comparative Example. In Table 1, in the glass cloth column, the layer containing glass cloth is expressed as "Yes", and the layer containing no glass cloth is expressed as "No".

TABLE 1

|  |  | Example 1 | Example 2 | Examples 3, 5, 8, 9 | Example 4 | Example 6 | Example 7 | Comp. Ex. 1 | Comp. Ex. 2 | Comp. Ex. 3 | Comp. Ex. 4 |
|---|---|---|---|---|---|---|---|---|---|---|---|
| Center Layer | EA1020 | 35 | 35 | 35 | 35 | 35 | 35 | 35 | 35 | 35 | 35 |
|  | N740 | 35 | 35 | 35 | 35 | 35 | 35 | 35 | 35 | 35 | 35 |
|  | Styrene | 30 | 30 | 30 | 30 | 30 | 30 | 30 | 30 | 30 | 30 |
|  | CHP | 1 | 1 | 1 | 1 | 1 | 1 | 1 | 1 | 1 | 1 |
|  | 2E4MZ | 1 | 1 | 1 | 1 | 1 | 1 | 1 | 1 | 1 | 1 |
|  | CL303 | 75 | 75 | 75 | 75 | 75 | 75 | 75 | 75 | 75 | 75 |
|  | SO25R | 65 | 65 | 65 | 65 | 65 | 65 | 65 | 65 | 65 | 65 |
|  | SPB100 | 18 | 18 | 18 | 18 | 18 | 18 | 18 | 18 | 18 | 18 |
|  | Glass Cloth | Yes | Yes | Yes | Yes | Yes | Yes | Yes | Yes | No | Yes |
| First Resin Layer | BANI-M | 50 | — | — | — | 50 | — | — | — | — | — |
| Second Resin Layer | BMI2300 | 50 | — | — | — | 50 | — | — | — | — | — |
|  | V8005 | — | 50 | — | — | — | — | — | — | — | — |
|  | EXA9500 | — | 50 | — | — | — | — | — | — | — | — |
|  | N690 | — | — | 67 | 67 | — | 67 | — | 67 | 67 | 67 |
|  | TD2090 | — | — | 33 | 33 | — | 33 | — | 33 | 33 | 33 |
|  | 2E4MZ | — | 2 | 1 | 1 | — | 1 | — | 1 | 1 | 1 |
|  | SO25R | 300 | 300 | 300 | 70 | 300 | 40 | — | — | 300 | 300 |
|  | CL303 | 15 | — | — | — | 15 | — | — | — | — | — |
|  | Glass Cloth | No | No | No | No | No | No | No | No | No | Yes | thicknesses of the first resin layer and the second resin layer became 5 μm and 5 μm, respectively.

Comparative Example 1

Comparative Example 1 is similar to Example 1, except that a metal-clad laminate was manufactured so that a thickness of the center layer became 60 μm, without providing the first layer and the second layer.

Comparative Example 2

Comparative Example 2 is similar to Example 3, except that for the resin composition of the first resin layer and the resin composition of the second resin layer, there was used a resin composition, whose content of silica particles (SO25R manufactured by Admatechs Co., Ltd.), as an inorganic filler, was changed from 300 parts by mass of to 0 part by mass.

In the metal-clad laminate thus obtained, the coefficient of thermal expansion of the cured product of the resin composition contained in the center layer was 47 ppm/° C., the coefficient of thermal expansion of the cured product of the resin composition contained in the first resin layer was 55 ppm/° C., and the coefficient of thermal expansion of the cured product of the resin composition contained in the second resin layer was 55 ppm/° C.

Comparative Example 3

Comparative Example 3 is similar to Example 3, except that in manufacturing the center layer, glass cloth was not used.

Comparative Example 4

Comparative Example 4 is similar to Example 3, except that in manufacturing the first resin layer and the second resin layer, the glass cloth (1037 type, one plain weave) was contained.

Table 1 shows collectively compositions of resin compositions for forming each layer in each Example and each

[Evaluation Method]

The copper-clad laminate obtained (metal-clad laminate) was evaluated as follows.

(Coefficient of Thermal Expansion of the Metal-Clad Laminate)

The coefficient of thermal expansion of the metal-clad laminate obtained was measured in the temperature range of 40° C. to 125° C., by the TMA method, based on JIS C 6481. Specifically, using a metal-clad laminate as a measurement object, measurement was performed by a method similar to that of measuring the coefficient of thermal expansion of the cured product of the resin composition described above.

(Flexibility)

The metal-clad laminate obtained was cut so that a width became 10 mm and a length became 50 mm. Thereafter, a copper foil as a metal foil was removed from the cut metal-clad laminate, by etching. The laminate from which the copper foil was removed was wound around a cylindrical rod consisting of stainless steel having a diameter of 20 mm. At this time, the laminate was wound so as to cover a half or more of the arc. Thereafter, the laminate was returned to an original state, and a portion that was wound around the rod was visually observed. When any damage such as cracks was not confirmed, this portion was evaluated as "O", and when damage such as cracks was confirmed, this portion was rated as "x".

(Appearance after Etching)

The copper foil as a metal foil was removed from the obtained metal-clad laminate, by etching. A surface of the laminate from which the copper foil was removed was visually observed. When the occurrence of appearance defects such as void and blur was not confirmed on the surface of the laminate, this was evaluated as "0", and when the occurrence of appearance defects such as void and blur was confirmed on the surface of the laminate, this was evaluated as "x".

Results of this evaluation are shown in Table 2, together with coefficients of thermal expansion of the cured products of resin compositions configuring the respective layers and thicknesses of the layers. Post-etching appearance evaluation results marked with x signify inappropriate items for metal-clad laminates, hence the measurement of coefficient of thermal expansion is not implemented on these items. They are marked with "–" in Table 2.

after etching, as compared with Examples 1 to 9. That is, some problems occurred in the insulating layer of the metal-clad laminate, or even when the appearance after the

TABLE 2

|  |  | Examples | | | | | | | | | Comp. Ex. | | | |
| --- | --- | --- | --- | --- | --- | --- | --- | --- | --- | --- | --- | --- | --- | --- |
|  |  | 1 | 2 | 3 | 4 | 5 | 6 | 7 | 8 | 9 | 1 | 2 | 3 | 4 |
| Coefficient of Thermal Expansion of Cured Product | Center layer (ppm/° C.) | 47 | 47 | 47 | 47 | 47 | 47 | 47 | 47 | 47 | 47 | 47 | 47 | 47 |
|  | First resin layer (ppm/° C.) | 16 | 18 | 21 | 40 | 21 | 16 | 45 | 21 | 21 | — | 55 | 21 | 21 |
|  | Second resin layer (ppm/° C.) | 16 | 18 | 21 | 40 | 21 | 16 | 45 | 21 | 21 | — | 55 | 21 | 21 |
|  | First/Center resin layers (%) | 34.0 | 38.3 | 44.7 | 85.1 | 44.7 | 34.0 | 95.7 | 44.7 | 44.7 | — | 117.0 | 44.7 | 44.7 |
| Thickness | Center layer (μm) | 40 | 40 | 40 | 40 | 180 | 30 | 40 | 210 | 190 | 60 | 40 | 40 | 40 |
|  | First resin layer (μm) | 10 | 10 | 10 | 10 | 10 | 15 | 10 | 25 | 5 | — | 10 | 10 | 10 |
|  | Second resin layer (μm) | 10 | 10 | 10 | 10 | 10 | 15 | 10 | 25 | 5 | — | 10 | 10 | 10 |
|  | First/Center resin layers (%) | 25.0 | 25.0 | 25.0 | 25.0 | 5.6 | 50.0 | 25.0 | 11.9 | 2.6 | — | 25.0 | 25.0 | 25.0 |
|  | Center + First resin + Second resin layers (μm) | 60 | 60 | 60 | 60 | 200 | 60 | 60 | 260 | 200 | 60 | 60 | 60 | 60 |
| Evaluation | CTE of metal-clad laminate (ppm/° C.) | 12 | 13 | 15 | 18 | 12 | 12 | 20 | 14 | 15 | 21 | 22 | — | — |
|  | Flexibility | ○ | ○ | ○ | ○ | ○ | ○ | ○ | x | ○ | ○ | ○ | x | x |
|  | Appearance of etching | ○ | ○ | ○ | ○ | ○ | ○ | ○ | ○ | ○ | ○ | ○ | x | x |

In the metal-clad laminate including an insulating layer, and a metal layer present on at least one surface side of the insulating layer, the insulating layer being a laminate of at least three layers of a center layer, a first resin layer present at one surface side of the center layer, and a second resin layer present at the other surface side of the center layer, evaluation of differences of the configurations become clear from Table 2.

Specifically, in such a metal-clad laminate, the center layer contains a cured product of a resin composition, and a fiber base material. The first resin layer and the second resin layer consist of cured products of resin compositions, respectively. The resin composition in the center layer contains a thermosetting resin. A resin contained in the resin composition in the center layer is different from resins contained in the resin compositions in the first resin layer and the second resin layer. A coefficient of thermal expansion of the cured product of the resin composition contained in the first resin layer and a coefficient of thermal expansion of the cured product of the resin composition contained in the second resin layer are respectively smaller than a coefficient of thermal expansion of the cured product of the resin composition contained in the center layer (Examples 1 to 9). In this case, the metal-clad laminate after etching has excellent appearance, and the coefficient of thermal expansion is small of 20 ppm/° C. or less. From this, it is clear that the metal-clad laminate with high reliability capable of sufficiently suppressing the occurrence of warpage was obtained.

When the above configuration is not satisfied (Comparative Examples 1 to 4), defects occurred in the appearance after etching, as compared with Examples 1 to 9. That is, some problems occurred in the insulating layer of the metal-clad laminate, or even when the appearance after the etching is excellent, the coefficient of thermal expansion of the metal-clad laminate exceeds 20 ppm/° C., and is not sufficiently small. From this, the metal-clad laminate did not have sufficiently high reliability capable of sufficiently suppressing the occurrence of warpage and the like.

When the coefficient of thermal expansion of the cured product of the resin composition contained in the first resin layer and the coefficient of thermal expansion of the cured product of the resin composition contained in the second resin layer are between 5% and 90%, respectively of the coefficient of thermal expansion of the cured product of the resin composition contained in the center layer (Examples 1 to 6, 8, and 9), it is clear that, as compared with Example 7 that does not satisfy this range, the coefficient of thermal expansion of the metal-clad laminate is much smaller. From this, it is clear that the above range is preferably between 5% and 90%.

When the coefficient of thermal expansion of the cured product of the resin composition contained in the first resin and the coefficient of thermal expansion of the cured product of the resin composition contained in the second resin are between 3 ppm/° C. and 40 ppm/° C. in a temperature range of 40° C. to 125° C. (Examples 1 to 6, 8, and 9), it is clear that, as compared with Example 7 that does not satisfy this range, the coefficient of thermal expansion of the metal-clad laminate is even smaller. From this, it is clear that 3 ppm/° C. to 40 ppm/° C. is preferable for the above range.

When the thickness of the insulating layer is between 20 μm and 250 μm (Examples 1 to 7, and 9), as compared with Example 8 that does not satisfy this range, it is clear that flexibility is excellent. When the thickness of the insulating layer is between 20 μm and 250 μm, it is clear that the coefficient of thermal expansion of the metal-clad laminate is small, and the metal-clad laminate is excellent in flexibility not only just being capable of suppressing the occurrence of warpage.

While the present specification discloses techniques of various aspects as described above, main techniques out of these techniques are summarized below.

A metal-clad laminate according to one aspect of the present invention includes an insulating layer, and a metal layer present on at least one surface side of the insulating layer. The insulating layer is a laminate of at least three layers of a center layer, a first resin layer present at one surface side of the center layer, and a second resin layer present at the other surface side of the center layer. The center layer contains a cured product of a resin composition, and a fiber base material. The first resin layer and the second resin layer consist of cured products of resin compositions, respectively. The resin composition in the center layer contains a thermosetting resin. A resin contained in the resin composition in the center layer is different from resins contained in the resin compositions in the first resin layer and the second resin layer. A coefficient of thermal expansion of the cured product of the resin composition contained in the first resin layer and a coefficient of thermal expansion of the cured product of the resin composition contained in the second resin layer are respectively smaller than a coefficient of thermal expansion of the cured product of the resin composition contained in the center layer.

According to such a configuration, a metal-clad laminate with high reliability can be provided. A package of an electronic component obtained by using a substrate, such as a printed wiring board, formed with a circuit by partially removing a metal layer on the surface of the obtained metal-clad laminate can suppress occurrence of deformation of the substrate such as warpage, even when the package is used in an environment having a large temperature change. Further, based on this, the occurrence of damage such as the occurrence of cracks near the surface of the substrate can be suppressed sufficiently.

When the center layer contains a fiber base material as well as the cured product of the resin composition, it is considered possible to improve insulation reliability and flexibility. Also From this, it is considered possible to manufacture an electronic component with high reliability.

In the metal-clad laminate, it is preferable that the coefficient of thermal expansion of the cured product of the resin composition contained in the first resin layer and the coefficient of thermal expansion of the cured product of the resin composition contained in the second resin layer are between 5% and 90%, respectively of the coefficient of thermal expansion of the cured product of the resin composition contained in the center layer.

According to such a configuration, a metal-clad laminate with higher reliability can be obtained. When a package of an electronic component is manufactured by using the metal-clad laminate obtained, a package of an electronic component with sufficiently high reliability can be obtained.

In the metal-clad laminate, it is preferable that the coefficient of thermal expansion of the cured product of the resin composition contained in the first resin layer and the coefficient of thermal expansion of the cured product of the resin composition contained in the second resin layer are between 3 ppm/° C. and 40 ppm/° C. in a temperature range of 40° C. to 125° C., respectively.

According to such a configuration, a metal-clad laminate with higher reliability can be obtained. When a package of an electronic component is manufactured by using the metal-clad laminate obtained, a package of an electronic component with sufficiently high reliability can be obtained.

In the metal-clad laminate, it is preferable that the resin compositions of the first resin layer and the second resin layer are resin compositions containing a thermosetting compound containing an imide skeleton in the molecule.

According to such a configuration, a metal-clad laminate with higher reliability can be obtained. When a package of an electronic component is manufactured by using the metal-clad laminate obtained, a package of an electronic component with sufficiently high reliability can be obtained.

In the metal-clad laminate, it is preferable that thicknesses of the first resin layer and the second resin layer are between 1 μm and 25 μm.

According to such a configuration, a metal-clad laminate with higher reliability can be obtained. When a package of an electronic component is manufactured by using the metal-clad laminate obtained, a package of an electronic component with sufficiently high reliability can be obtained.

In the metal-clad laminate, it is preferable that a thickness of the insulating layer is between 20 μm and 250 μm.

According to such a configuration, a metal-clad laminate with higher reliability can be obtained. When a package of an electronic component is manufactured by using the metal-clad laminate obtained, a package of an electronic component with sufficiently high reliability can be obtained.

This is considered attributable to that rigidity and insulation can be improved because the insulating layer is thick to some extent.

In the metal-clad laminate, it is preferable that the resin composition in the center layer contains a radical polymerization type thermosetting compound.

According to such a configuration, a metal-clad laminate with higher reliability can be obtained. When a package of an electronic component is manufactured by using the metal-clad laminate obtained, a package of an electronic component with sufficiently high reliability can be obtained.

Because the radical polymerization type thermosetting compound is included for the resin composition in the center layer, it is considered possible to suitably cure the resin composition in the center layer and form a suitable center layer.

Further, when the center layer contains a fiber base material such as glass cloth, the center layer is considered to be a layer obtained by impregnating a resin composition into the fiber base material and by curing the resin composition. In this case, when the radical polymerization type thermosetting compound is contained as the resin composition in the center layer, it is considered possible to form a more suitable center layer with excellent impregnation of the resin composition into the fiber base material.

From these facts, it is considered possible to provide a metal-clad laminate with higher reliability.

In the metal-clad laminate, it is preferable that the resin composition in the center layer is a liquid resin composition.

According to such a configuration, a metal-clad laminate with higher reliability can be obtained. When a package of an electronic component is manufactured by using the metal-clad laminate obtained, a package of an electronic component with sufficiently high reliability can be obtained.

This is considered for the following reasons.

First, by using the liquid resin composition for the resin composition in the center layer, it is considered possible to form a suitable center layer with, for example, a smooth surface.

Further, when the center layer contains a fiber base material such as glass cloth, the center layer is considered to be a layer obtained by impregnating a resin composition into the fiber base material and by curing the resin composition. In this case, when a liquid resin composition is used as the resin composition in the center layer, it is considered possible to form a more suitable center layer with excellent impregnation of the resin composition into the fiber base material.

From these facts, it is considered possible to provide a metal-clad laminate with higher reliability.

In the metal-clad laminate, it is preferable that a metal layer is arranged on both surfaces of the insulating layer.

By arranging such a configuration, by partially removing a metal layer on the surface, a substrate on both sides of which metal wirings are formed can be formed. A metal-clad laminate on both surfaces of which a metal wiring can be formed can also exhibit high reliability. By manufacturing a package of an electronic component using such a metal-clad laminate, a package of the electronic components with high reliability can be manufactured.

Further, a printed wiring board according to another aspect of the present invention is obtained by forming a circuit by partially removing the metal layer of the metal-clad laminate.

According to such a configuration, a printed wiring board with high reliability can be provided.

INDUSTRIAL APPLICABILITY

According to the present invention, a metal-clad laminate with sufficiently high reliability is provided. Further, a printed wiring board manufactured by using the metal-clad laminate is provided.

The invention claimed is:

1. A metal-clad laminate comprising:
an insulating layer, and a metal layer present on at least one surface side of the insulating layer, wherein
the insulating layer is a laminate of at least three layers of a center layer, a first resin layer present on one surface side of the center layer, and a second resin layer present on the other surface side of the center layer,
the center layer contains a cured product of a resin composition, and a fiber base material,
the first resin layer and the second resin layer are formed of cured products of resin compositions, respectively, the resin composition in the center layer contains a thermosetting resin,
a resin contained in the resin composition in the center layer is different from resins contained in the resin compositions in the first resin layer and the second resin layer, and
a coefficient of thermal expansion of the cured product of the resin composition contained in the first resin layer and a coefficient of thermal expansion of the cured product of the resin composition contained in the second resin layer are between 10% and 70%, respectively, of a coefficient of thermal expansion of the cured product of the resin composition contained in the center layer.

2. The metal-clad laminate according to claim 1, wherein the coefficient of thermal expansion of the cured product of the resin composition contained in the first resin layer and the coefficient of thermal expansion of the cured product of the resin composition contained in the second resin layer are between 3 ppm/° C. and 40 ppm/° C. in a temperature range of 40° C. to 125° C., respectively.

3. The metal-clad laminate according to claim 1, wherein the resin compositions of the first resin layer and the second resin layer are resin compositions containing a thermosetting compound containing an imide skeleton in a molecule.

4. The metal-clad laminate according to claim 1, wherein thicknesses of the first resin layer and the second resin layer are between 1 μm and 25 μm.

5. The metal-clad laminate according to claim 1, wherein a thickness of the insulating layer is between 20 μm and 250 μm.

6. The metal-clad laminate according to claim 1, wherein the resin composition in the center layer contains a radical polymerization type thermosetting compound.

7. The metal-clad laminate according to claim 1, wherein the resin composition in the center layer is a liquid resin composition.

8. The metal-clad laminate according to claim 1, wherein the metal layer is arranged on both surfaces of the insulating layer.

9. A printed wiring board obtained by forming a circuit by partially removing the metal layer of the metal-clad laminate according to claim 1.

* * * * *